US009786709B1

(12) United States Patent
Hsu (10) Patent No.: US 9,786,709 B1
(45) Date of Patent: Oct. 10, 2017

(54) PORTABLE ELECTRONIC DEVICE AND IMAGE CAPTURING MODULE THEREOF

(71) Applicant: Chi-Hsing Hsu, New Taipei (TW)

(72) Inventor: Chi-Hsing Hsu, New Taipei (TW)

( * ) Notice: Subject to any disclaimer, the term of this patent is extended or adjusted under 35 U.S.C. 154(b) by 0 days.

(21) Appl. No.: 15/290,734

(22) Filed: Oct. 11, 2016

(51) Int. Cl.
*H01L 27/146* (2006.01)
*H01L 25/04* (2014.01)

(52) U.S. Cl.
CPC ...... *H01L 27/14634* (2013.01); *H01L 25/042* (2013.01); *H01L 27/14618* (2013.01); *H01L 27/14625* (2013.01); *H01L 27/14636* (2013.01); *H01L 27/14643* (2013.01)

(58) Field of Classification Search
CPC ............. H01L 27/14634; H01L 25/042; H01L 27/14625; H01L 27/14643; H01L 27/14618; H01L 27/14636
See application file for complete search history.

(56) References Cited

U.S. PATENT DOCUMENTS 7,091,571 B1 *  8/2006  Park ................... H01L 27/14618
                                                  257/432
7,227,236 B1 *  6/2007  Lee .......................... G02B 7/02
                                                  257/294

* cited by examiner

*Primary Examiner* — David Vu
(74) *Attorney, Agent, or Firm* — Li & Cai Intellectual Property (USA) Office (57) ABSTRACT

A portable electronic device and an image capturing module thereof are disclosed. The image capturing module includes a circuit substrate, a structure reinforcing frame, a plurality of image sensing chips, an adhesive body, and a plurality of lens modules. The circuit substrate has a plurality of first passing openings. The structure reinforcing frame is disposed on the circuit substrate, and the structure reinforcing frame has a plurality of second passing openings respectively communicated with the first passing openings. The image sensing chips is electrically connected with the circuit substrate by wire bonding, and the image sensing chips are coplanarly disposed on a datum plane. The adhesive body is connected between each image sensing chip and the structure reinforcing frame. The lens modules are disposed on the circuit substrate, and the lens modules respectively correspond to the image sensing chips.

10 Claims, 9 Drawing Sheets

PORTABLE ELECTRONIC DEVICE AND IMAGE CAPTURING MODULE THEREOF

BACKGROUND OF THE INVENTION

1. Field of the Invention

The instant disclosure relates to a portable electronic device and an image capturing module thereof, and more particularly to a portable electronic device and an image capturing module thereof for maintaining the optimum coplanarity of the image sensing chips.

2. Description of Related Art

The advantage of CMOS (Complementary Metal-Oxide-Semiconductor) is low power consumption and small size, thus the CMOS image-sensing chip package module can integrate into portable electronic devices with small size such as mobile phones and notebooks. However, the coplanarity of the two image sensors applied to a conventional dual camera system on a smart phone is inferior.

SUMMARY OF THE INVENTION

One aspect of the instant disclosure relates to a portable electronic device and an image capturing module thereof.

One of the embodiments of the instant disclosure provides an image capturing module, comprising a circuit substrate, a structure reinforcing frame, a plurality of image sensing chips, an adhesive body, and a plurality of lens modules. The circuit substrate has a top surface, a bottom surface, and a plurality of first passing openings connected between the top surface and the bottom surface. The structure reinforcing frame is disposed on the bottom surface of the circuit substrate, and the structure reinforcing frame has a plurality of second passing openings respectively communicated with the first passing openings. The image sensing chips are respectively disposed inside the second passing openings and electrically connected with the circuit substrate by wire bonding. The image sensing chips are coplanarly disposed on a datum plane, each image sensing chip has an image sensing area disposed on a front side thereof, and the image sensing areas of the image sensing chips respectively face the first passing openings in the circuit substrate. The adhesive body is disposed on the structure reinforcing frame, and the adhesive body is connected between each image sensing chip and the structure reinforcing frame for enclosing a gap between the image sensing chip and the structure reinforcing frame. The lens modules are disposed on the top surface of the circuit substrate. Each lens module includes an opaque casing disposed on the top surface of the circuit substrate and a lens assembly held by the opaque casing, and the lens assemblies of the lens modules respectively correspond to the image sensing areas of the image sensing chips.

More particularly, the structure reinforcing frame has a plurality of convex bodies opposite to the circuit substrate and passing through the adhesive body, and all of the image sensing chips, the adhesive body, and the convex bodies are coplanarly disposed on the datum plane, so that a back side of each image sensing chip, a bottom surface of the adhesive body, and a bottom surface of each convex body are flush with each other and exposed to the outside.

More particularly, the image capturing module further comprises a heat dissipation substrate. The structure reinforcing frame has a plurality of convex bodies opposite to the circuit substrate and passing through the adhesive body, and all of the image sensing chips, the adhesive body, and the convex bodies are coplanarly disposed on the heat dissipation substrate, so that a back side of each image sensing chip, a bottom surface of the adhesive body, and a bottom surface of each convex body are flush with each other and contact the heat dissipation substrate.

More particularly, the image capturing module further comprises an auxiliary frame, a plurality of connection bodies, and a plurality of light-transmitting substrates. The auxiliary frame is disposed on the top surface of the circuit substrate, and each connection body passes through the circuit substrate and is connected between the structure reinforcing frame and the auxiliary frame, so that the circuit substrate is firmly clamped between the structure reinforcing frame and the auxiliary frame. The light-transmitting substrates are respectively disposed inside the first passing openings, each light-transmitting substrate is disposed above the corresponding image sensing chip through a plurality of support members, and each light-transmitting substrate is disposed between the corresponding image sensing chip and the corresponding lens assembly. The image sensing chip is electrically connected to the circuit substrate through a plurality of conductive wires.

Another one of the embodiments of the instant disclosure provides a portable electronic device, comprising an electronic module and an image capturing module. The image capturing module is disposed on the electronic module, and the image capturing module comprises a circuit substrate, a structure reinforcing frame, a plurality of image sensing chips, an adhesive body, and a plurality of lens modules. The circuit substrate has a top surface, a bottom surface, and a plurality of first passing openings connected between the top surface and the bottom surface. The structure reinforcing frame is disposed on the bottom surface of the circuit substrate, and the structure reinforcing frame has a plurality of second passing openings respectively communicated with the first passing openings. The image sensing chips are respectively disposed inside the second passing openings and electrically connected with the circuit substrate by wire bonding. The image sensing chips are coplanarly disposed on a datum plane, each image sensing chip has an image sensing area disposed on a front side thereof, and the image sensing areas of the image sensing chips respectively face the first passing openings in the circuit substrate. The adhesive body is disposed on the structure reinforcing frame, and the adhesive body is connected between each image sensing chip and the structure reinforcing frame for enclosing a gap between the image sensing chip and the structure reinforcing frame. The lens modules are disposed on the top surface of the circuit substrate. Each lens module includes an opaque casing disposed on the top surface of the circuit substrate and a lens assembly held by the opaque casing, and the lens assemblies of the lens modules respectively correspond to the image sensing areas of the image sensing chips.

More particularly, the image capturing module further comprises a heat dissipation substrate, the structure reinforcing frame has a plurality of convex bodies opposite to the circuit substrate and passing through the adhesive body, and all of the image sensing chips, the adhesive body, and the convex bodies are coplanarly disposed on the heat dissipation substrate, so that a back side of each image sensing chip, a bottom surface of the adhesive body, and a bottom surface of each convex body are flush with each other and contact the heat dissipation substrate.

More particularly, the image capturing module further comprises an auxiliary frame, a plurality of connection bodies, and a plurality of light-transmitting substrates. The auxiliary frame is disposed on the top surface of the circuit substrate, and each connection body passes through the circuit substrate and is connected between the structure reinforcing frame and the auxiliary frame, so that the circuit substrate is firmly clamped between the structure reinforcing frame and the auxiliary frame. The light-transmitting substrates are respectively disposed inside the first passing openings, each light-transmitting substrate is disposed above the corresponding image sensing chip through a plurality of support members, and each light-transmitting substrate is disposed between the corresponding image sensing chip and the corresponding lens assembly. The image sensing chip is electrically connected to the circuit substrate through a plurality of conductive wires.

Yet another one of the embodiments of the instant disclosure provides an image capturing module, comprising a circuit substrate, a plurality of image sensing chips, an adhesive body, and a plurality of lens modules. The circuit substrate has a plurality of first passing openings. The image sensing chips is respectively disposed inside the first passing openings and electrically connected with the circuit substrate by wire bonding, and the image sensing chips and the circuit substrate are coplanarly disposed on a datum plane. The adhesive body is connected between each image sensing chip and the circuit substrate. The lens modules are disposed on the circuit substrate, and the lens modules respectively correspond to the image sensing chips.

Therefore, the optimum coplanarity of the image sensing chips can be maintained and the clearness of images captured by the image capturing module can be increased due to the image sensing chips being coplanarly disposed on a datum plane and the adhesive body being connected between each image sensing chip and the structure reinforcing frame, or the adhesive body being connected between each image sensing chip and the circuit substrate.

To further understand the techniques, means and effects of the instant disclosure, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DETAILED DESCRIPTION OF THE PREFERRED EMBODIMENTS

Embodiments of a portable electronic device and an image capturing module thereof according to the instant disclosure are described herein. Other advantages and objectives of the instant disclosure can be easily understood by one skilled in the art from the disclosure. The instant disclosure can be applied in different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way.

First Embodiment

Figure 1:
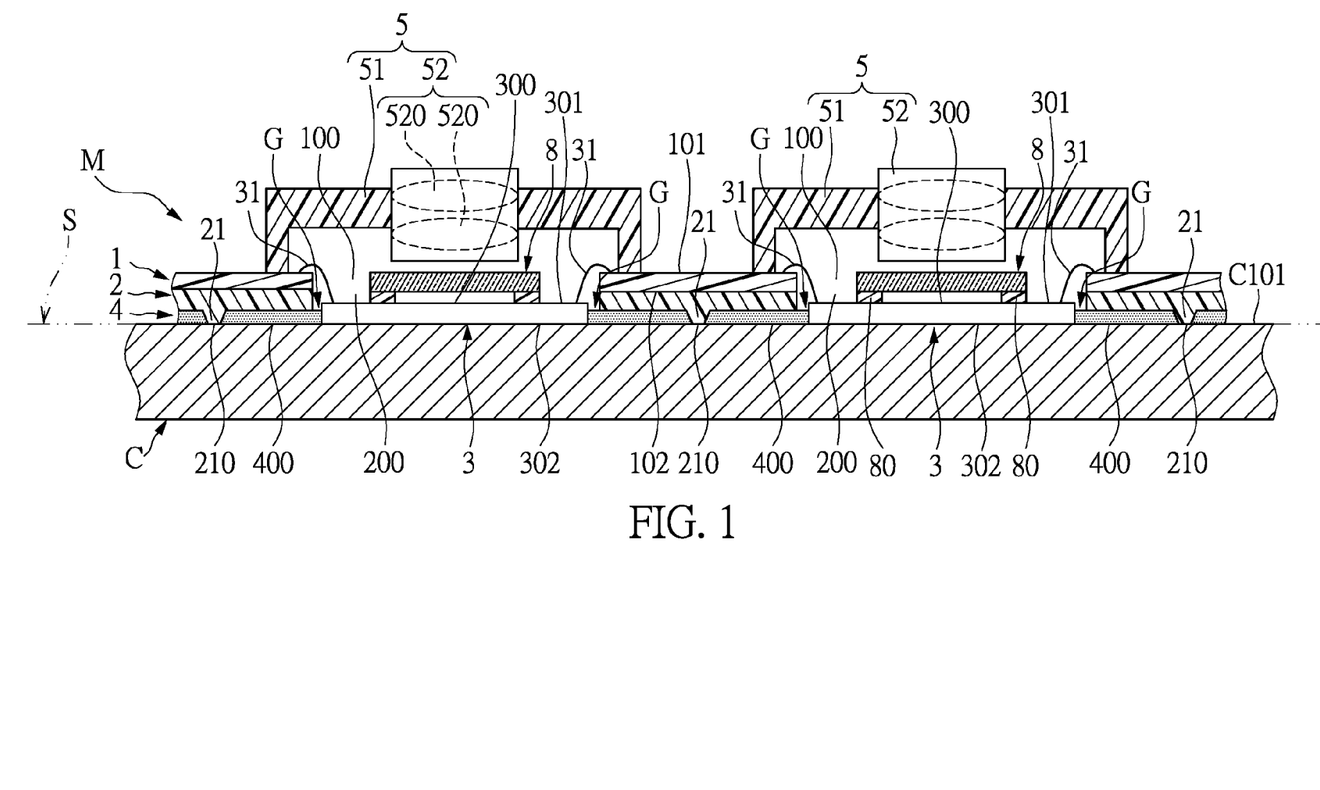
FIG. 1 shows a cross-sectional, schematic view of the image capturing module disposed on the carrier substrate according to the first embodiment of the instant disclosure.
Figure 2:
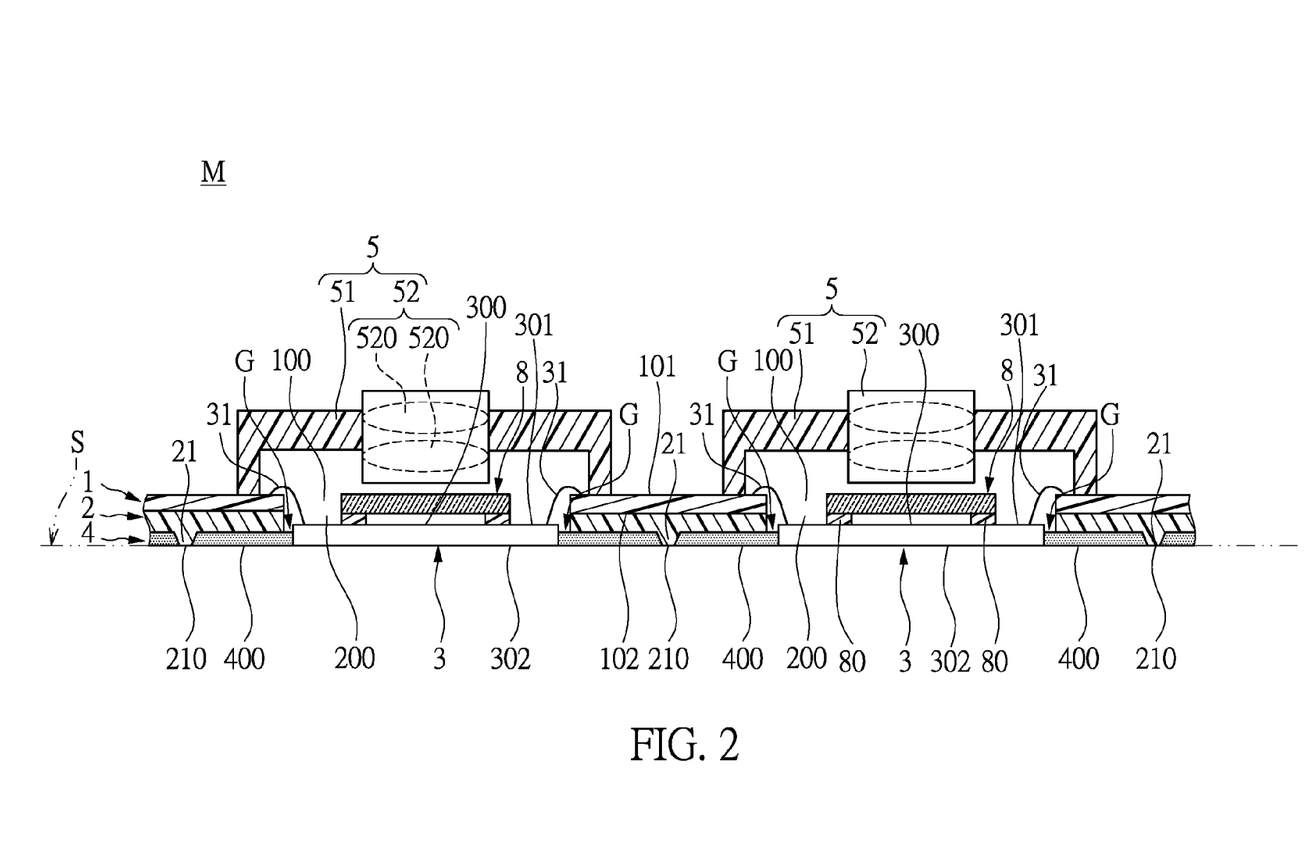
FIG. 2 shows a cross-sectional, schematic view of the image capturing module according to the first embodiment of the instant disclosure.

Referring to FIG. 1 and FIG. 2, the first embodiment of the instant disclosure provides an image capturing module M, comprising: a circuit substrate 1, a structure reinforcing frame 2, a plurality of image sensing chips 3, an adhesive body 4, and a plurality of lens modules 5. As shown in FIG. 1, the instant disclosure can use a carrier substrate C to carry the image capturing module M during the manufacturing of the image capturing module M, and the carrier substrate C has a top surface C101 as a datum plane. As shown in FIG. 2, after the image capturing module M is finished, the carrier substrate C is removed so as to separate the image capturing module M from the carrier substrate C.

First, referring to FIG. 1 and FIG. 2, the circuit substrate 1 has a top surface 101, a bottom surface 102, and a plurality of first passing openings 100 connected between the top surface 101 and the bottom surface 102. In addition, the structure reinforcing frame 2 is disposed on the bottom surface 102 of the circuit substrate 1, and the structure reinforcing frame 2 has a plurality of second passing openings 200 respectively communicated with the first passing openings 100. Please note, the structure reinforcing frame 2 may be a hard frame or a rigid frame having rigidity stronger than that of the circuit substrate 1, and the structure reinforcing frame 2 may be a big single frame or may be composed of many small frames.

Moreover, referring to FIG. 1 and FIG. 2, the image sensing chips 3 are respectively disposed inside the second passing openings 200 and electrically connected with the circuit substrate 1 by wire bonding, and the image sensing chips 3 are coplanarly disposed on a datum plane S (i.e., a referring plane). More particularly, each image sensing chip 3 has an image sensing area 300 disposed on a front side 301 thereof, and the image sensing areas 300 of the image sensing chips 3 respectively face the first passing openings 100 in the circuit substrate 1. For example, the image sensing chip 3 may be a CMOS (Complementary Metal-Oxide-Semiconductor) sensor or any kind of image capturing sensor.

In addition, referring to FIG. 1 and FIG. 2, the adhesive body 4 is disposed on the structure reinforcing frame 2 and between the structure reinforcing frame 2 and the carrier substrate C. More particularly, the adhesive body 4 can be surroundingly connected to the image sensing chips 3 so as to seal or enclose a gap G between the image sensing chip 3 and the structure reinforcing frame 2. For example, the adhesive body 4 can be made of any kind of adhesive material such as epoxy or silicone, or UV resin, thermosetting resin or AB resin.

Furthermore, referring to FIG. 1 and FIG. 2, the lens modules 5 are disposed on the top surface 101 of the circuit substrate 1. More particularly, each lens module 5 includes an opaque casing 51 disposed on the top surface 101 of the circuit substrate 1 and a lens assembly 52 held by the opaque casing 51, and the lens assemblies 52 of the lens modules 5 respectively correspond to the image sensing areas 300 of the image sensing chips 3. For example, the lens assembly 52 may be composed of a plurality of optical lenses 520, and the lens assembly 52 can be fixedly or movably disposed on the opaque casing 51.

More particularly, referring to FIG. 1 and FIG. 2, the image capturing module M further comprises a plurality of light-transmitting substrates 8. The light-transmitting substrates 8 are respectively disposed inside the first passing openings 100, each light-transmitting substrate 8 is disposed above the corresponding image sensing chip 3 through a plurality of support members 80, and each light-transmitting substrate 8 is disposed between the corresponding image sensing chip 3 and the corresponding lens assembly 52. In addition, the image sensing chip 3 is electrically connected to the circuit substrate 1 through a plurality of conductive wires 31 (such as gold wires) by a wire-bonding method.

More particularly, referring to FIG. 1 and FIG. 2, the structure reinforcing frame 2 has a plurality of convex bodies 21 (such as at least three convex bodies 21) opposite to the circuit substrate 1 and passing through the adhesive body 4. In addition, all of the image sensing chips 3, the adhesive body 4, and the convex bodies 21 are coplanarly disposed on the datum plane S (e.g., the top surface C101 of the carrier substrate C), so that a back side 302 of each image sensing chip 3, a bottom surface 400 of the adhesive body 4, and a bottom surface 210 of each convex body 21 are flush with each other and exposed to the outside (as shown in FIG. 2). Therefore, all of the image sensing chips 3, the adhesive body 4, and the convex bodies 21 are coplanarly disposed on the datum plane S, and the adhesive body 4 is connected between each image sensing chip 3 and the structure reinforcing frame 2, so that the optimum coplanarity of the image sensing chips 3 can be maintained and the clearness of images captured by the image capturing module M can be increased due to the rigidness of the structure reinforcing frame 2 being stronger than that of the circuit substrate 1 (e.g., the optical axes of the image sensing chips 3 are substantially parallel to each other without deviation).

In conclusion, as shown in FIG. 2, after the image capturing module M is finished, the carrier substrate C is removed so as to separate the image capturing module M from the carrier substrate C. The image sensing chips 3 can be coplanarly disposed on the same datum plane S without the carrier substrate C due to the rigidness of the structure reinforcing frame 2 being stronger than that of the circuit substrate 1, so that the optimum coplanarity of the image sensing chips 3 can be maintained and the clearness of the images captured by the image capturing module M can be increased due to the rigidness provided by the structure reinforcing frame 2. Please note, because the back side 302 of each image sensing chip 3 is exposed outside, the heat dissipation efficiency of the image sensing chips 3 can be increased.

Second Embodiment

Figure 3:
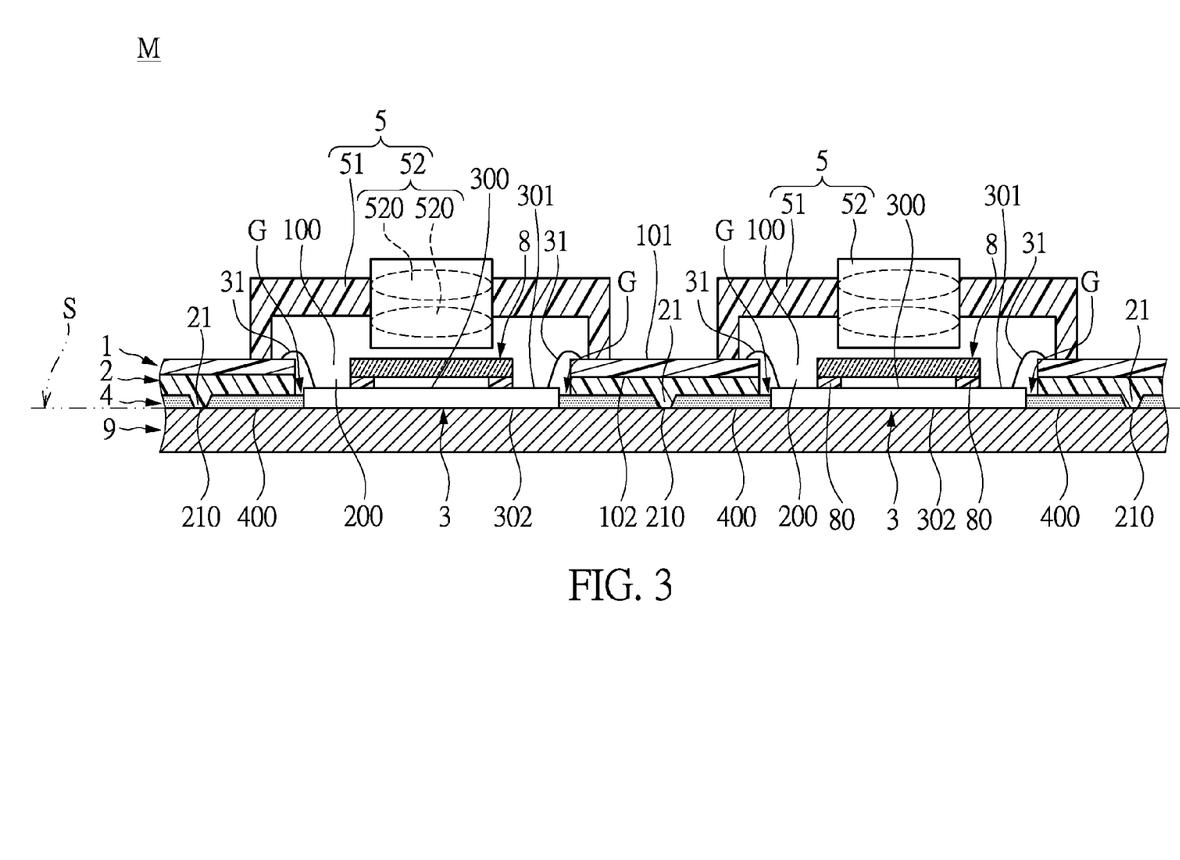
FIG. 3 shows a cross-sectional, schematic view of the image capturing module according to the second embodiment of the instant disclosure.

Referring to FIG. 3, the second embodiment of the instant disclosure provides an image capturing module M, comprising: a circuit substrate 1, a structure reinforcing frame 2, a plurality of image sensing chips 3, an adhesive body 4, and a plurality of lens modules 5. Comparing FIG. 3 with FIG. 2, the difference between the second embodiment and the first embodiment is as follows: the image capturing module M of the second embodiment further comprises a heat dissipation substrate 9.

More particularly, all of the image sensing chips 3, the adhesive body 4, and the convex bodies 21 are coplanarly disposed on the top surface of the heat dissipation substrate 9 (i.e., the top surface of the heat dissipation substrate 9 is the datum plane S), so that a back side 302 of each image sensing chip 3, a bottom surface 400 of the adhesive body 4, and a bottom surface 210 of each convex body 21 are flush with each other and directly contact the heat dissipation substrate 9. Therefore, all of the image sensing chips 3, the adhesive body 4, and the convex bodies 21 are coplanarly disposed on the heat dissipation substrate 9, and the adhesive body 4 is connected between each image sensing chip 3 and the structure reinforcing frame 2, so that the optimum coplanarity of the image sensing chips 3 can be maintained and the clearness of images captured by the image capturing module M can be increased due to the rigidness of the structure reinforcing frame 2 being stronger than that of the circuit substrate 1.

In conclusion, as shown in FIG. 2, after the image capturing module M is finished, the carrier substrate C is removed so as to separate the image capturing module M from the carrier substrate C. The image sensing chips 3 can be coplanarly disposed on the same datum plane S without the carrier substrate C due to the rigidness of the structure reinforcing frame 2 being stronger than that of the circuit substrate 1, so that the optimum coplanarity of the image sensing chips 3 can be maintained and the clearness of the images captured by the image capturing module M can be increased due to the rigidness provided by the structure reinforcing frame 2. Please note, because the back side 302 of each image sensing chip 3 is exposed outside, the heat dissipation efficiency of the image sensing chips 3 can be increased.

Third Embodiment

Figure 4:
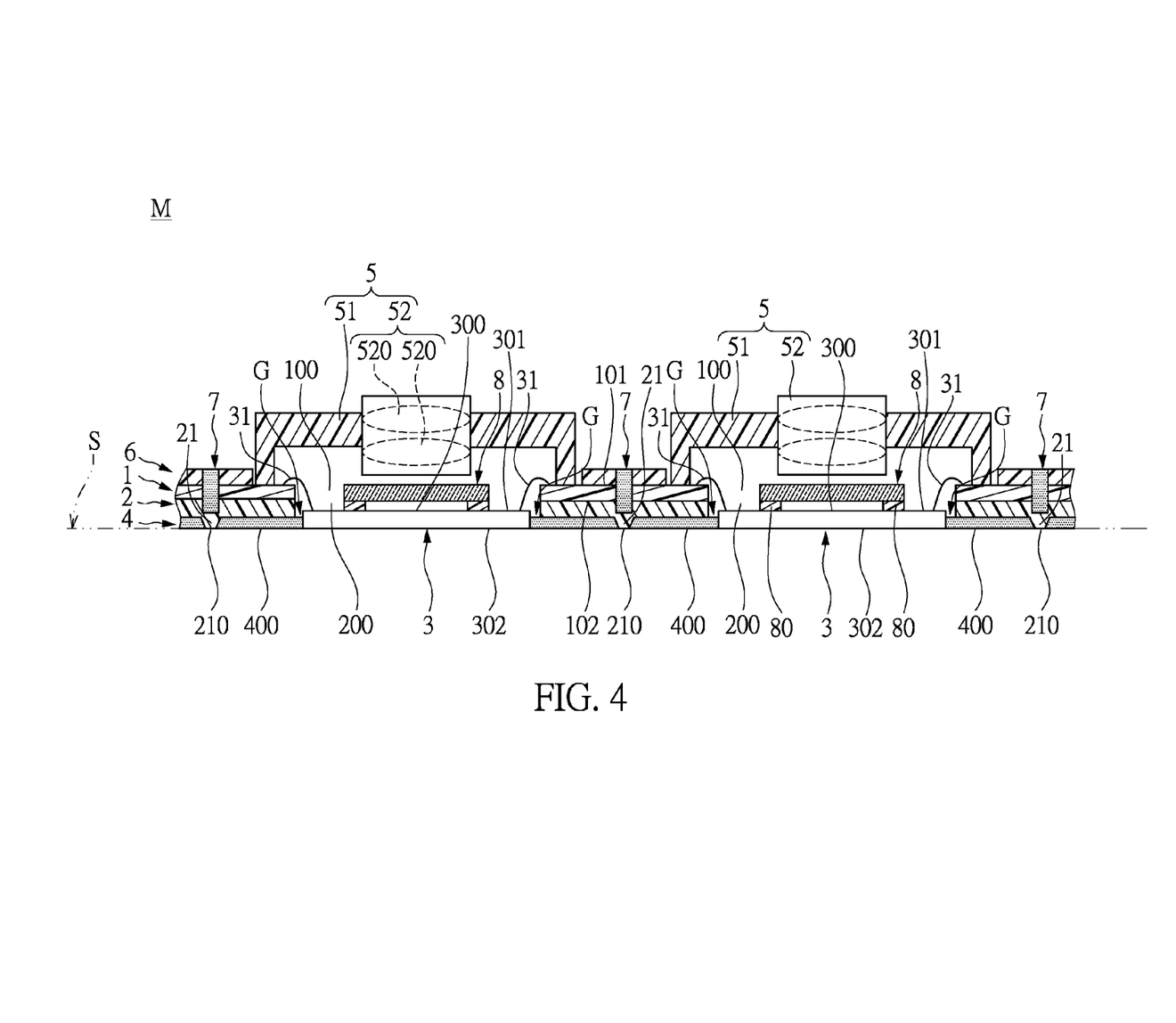
FIG. 4 shows a cross-sectional, schematic view of the image capturing module according to the third embodiment of the instant disclosure.

Referring to FIG. 4, the third embodiment of the instant disclosure provides an image capturing module M, comprising: a circuit substrate 1, a structure reinforcing frame 2, a plurality of image sensing chips 3, an adhesive body 4, and a plurality of lens modules 5. Comparing FIG. 4 with FIG. 2, the difference between the third embodiment and the first embodiment is as follows: the image capturing module M of the third embodiment further comprises an auxiliary frame 6 and a plurality of connection bodies 7.

More particularly, the auxiliary frame 6 is disposed on the top surface 101 of the circuit substrate 1, and each connection body 7 passes through the circuit substrate 1 and is connected between the structure reinforcing frame 2 and the auxiliary frame 6, so that the circuit substrate 1 can be firmly clamped between the structure reinforcing frame 2 and the auxiliary frame 6 so as to increase the stability of the circuit substrate 1 and the whole structural strength of the image capturing module M.

Fourth Embodiment

Figure 5:
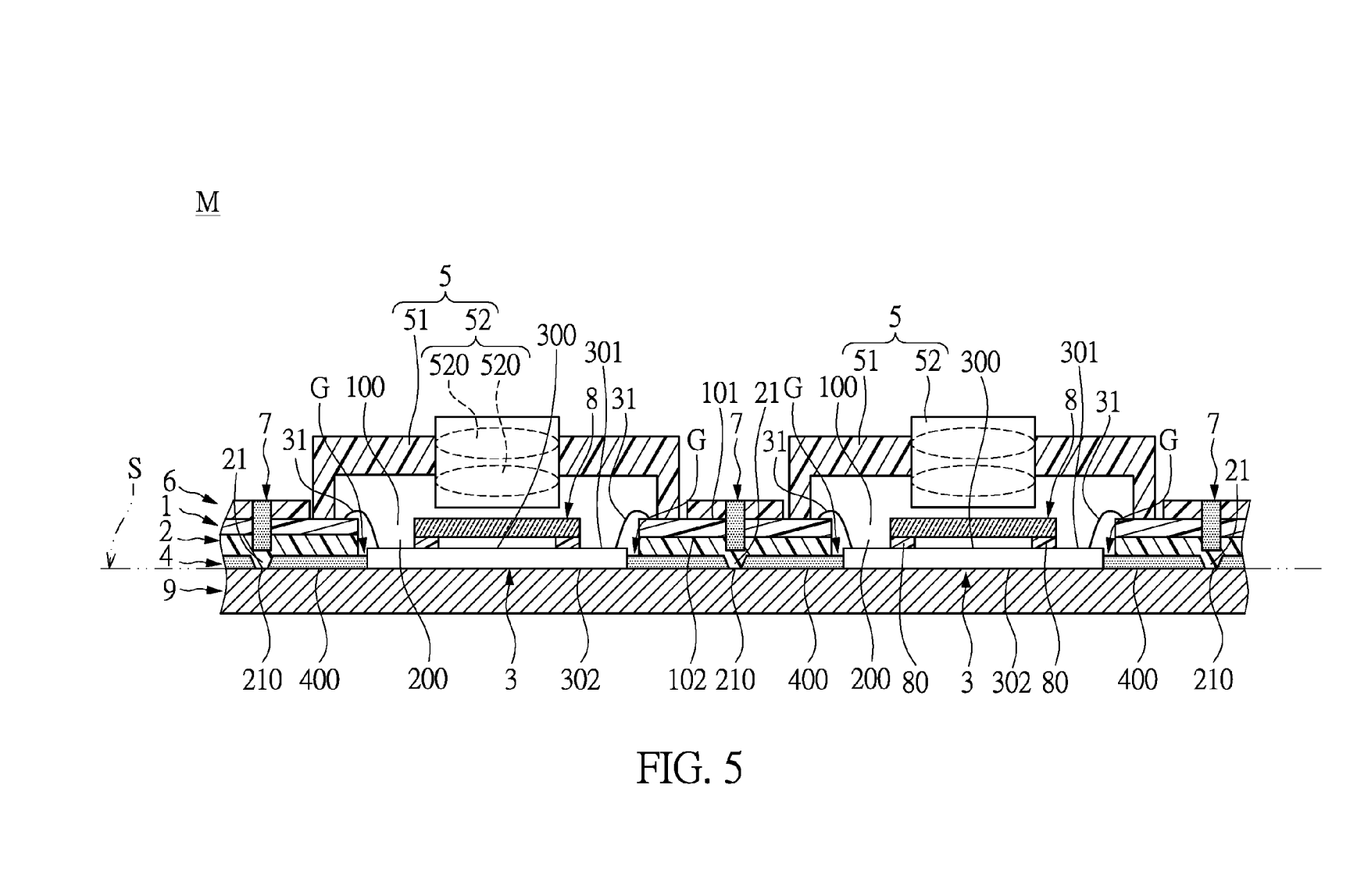
FIG. 5 shows a cross-sectional, schematic view of the image capturing module according to the fourth embodiment of the instant disclosure.

Referring to FIG. 5, the fourth embodiment of the instant disclosure provides an image capturing module M, comprising: a circuit substrate 1, a structure reinforcing frame 2, a plurality of image sensing chips 3, an adhesive body 4, and a plurality of lens modules 5. Comparing FIG. 5 with FIG. 4, the difference between the fourth embodiment and the third embodiment is as follows: the image capturing module M of the fourth embodiment further comprises a heat dissipation substrate 9.

More particularly, all of the image sensing chips 3, the adhesive body 4, and the convex bodies 21 are coplanarly disposed on the top surface of the heat dissipation substrate 9, so that a back side 302 of each image sensing chip 3, a bottom surface 400 of the adhesive body 4, and a bottom surface 210 of each convex body 21 are flush with each other and directly contact the heat dissipation substrate 9. Therefore, all of the image sensing chips 3, the adhesive body 4, and the convex bodies 21 are coplanarly disposed on the heat dissipation substrate 9, and the adhesive body 4 is connected between each image sensing chip 3 and the structure reinforcing frame 2, so that the optimum coplanarity of the image sensing chips 3 can be maintained and the clearness of images captured by the image capturing module M can be increased due to the rigidness of the structure reinforcing frame 2 being stronger than that of the circuit substrate 1.

Fifth Embodiment

Figure 6:
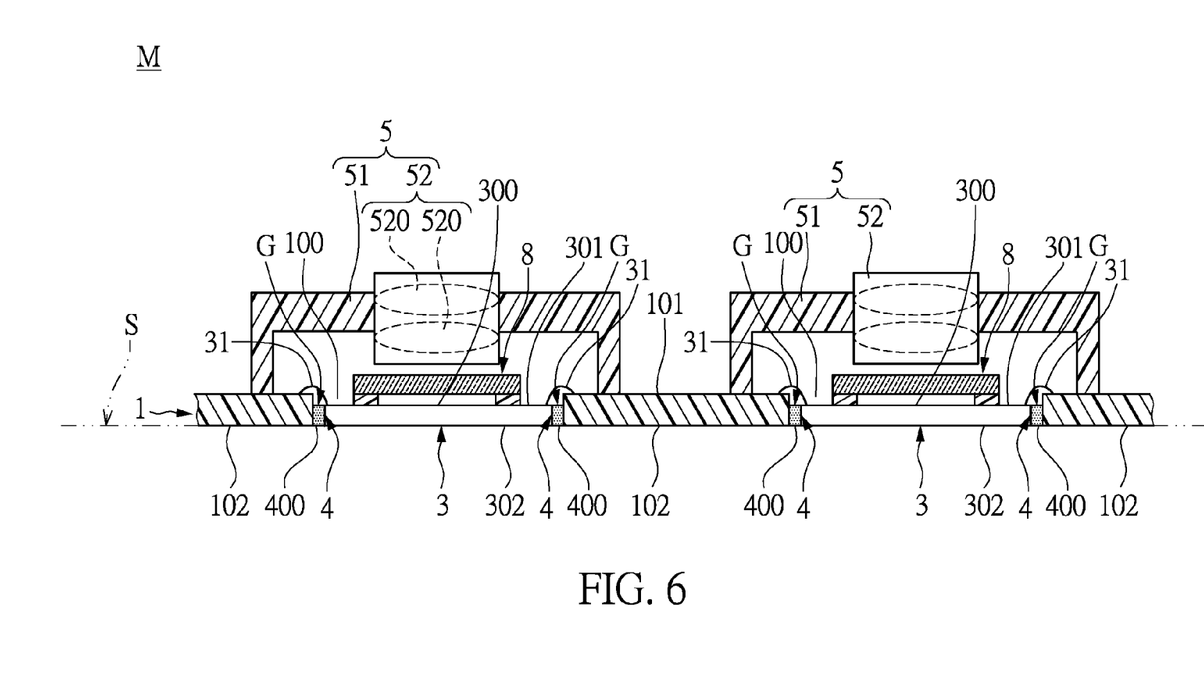
FIG. 6 shows a cross-sectional, schematic view of the image capturing module according to the fifth embodiment of the instant disclosure.

Referring to FIG. 6, the fifth embodiment of the instant disclosure provides an image capturing module M, comprising: a circuit substrate 1, a plurality of image sensing chips 3, an adhesive body 4, and a plurality of lens modules 5. Comparing FIG. 6 with FIG. 2, the difference between the fifth embodiment and the first embodiment is as follows: in the fifth embodiment, the adhesive body 4 is disposed between each image sensing chip 3 and the circuit substrate 1 and connected between each image sensing chip 3 and the circuit substrate 1 for enclosing a gap G between the image sensing chip 3 and the circuit substrate 1.

More particularly, all of the circuit substrate 1, the image sensing chips 3, and the adhesive body 4 are coplanarly disposed on the datum plane S, so that a back side 302 of each image sensing chip 3, a bottom surface 400 of the adhesive body 4, and a bottom surface 102 of the circuit substrate 1 are flush with each other and exposed to the outside (as shown in FIG. 2). Therefore, all of the circuit substrate 1, the image sensing chips 3, and the adhesive body 4 are coplanarly disposed on the datum plane S, and the adhesive body 4 is connected between each image sensing chip 3 and the circuit substrate 1, so that the optimum coplanarity of the image sensing chips 3 can be maintained and the clearness of images captured by the image capturing module M can be increased due to the rigidness provided by the circuit substrate 1 (such as a glass substrate or a silicon substrate having a predetermined circuit layout thereon). Please note, because the back side 302 of each image sensing chip 3 is exposed outside, the heat dissipation efficiency of the image sensing chips 3 can be increased.

Sixth Embodiment

Figure 7:
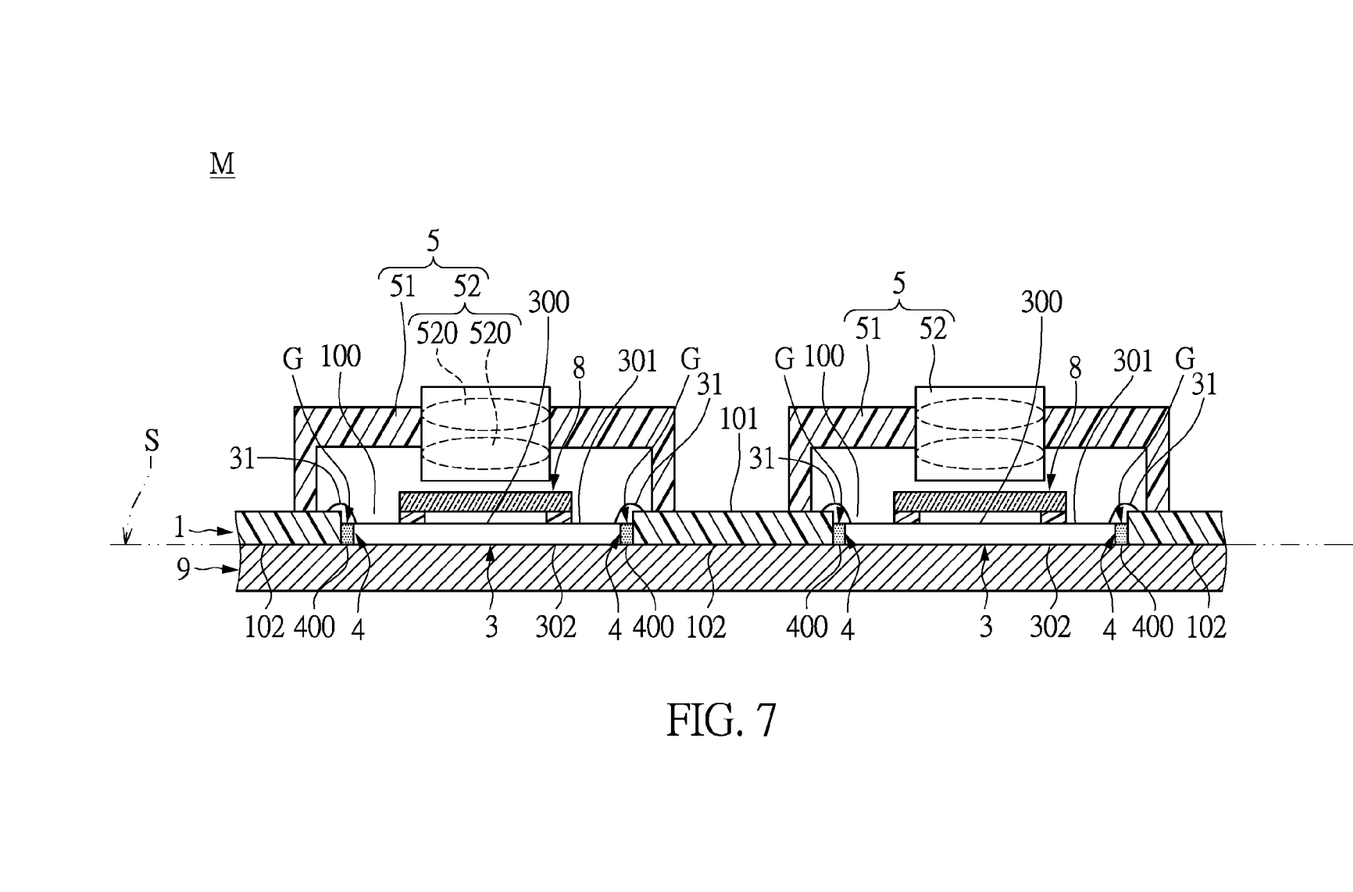
FIG. 7 shows a cross-sectional, schematic view of the image capturing module according to the sixth embodiment of the instant disclosure.

Referring to FIG. 7, the sixth embodiment of the instant disclosure provides an image capturing module M, comprising: a circuit substrate 1, a plurality of image sensing chips 3, an adhesive body 4, and a plurality of lens modules 5. Comparing FIG. 7 with FIG. 6, the difference between the sixth embodiment and the fifth embodiment is as follows: the image capturing module M of the sixth embodiment further comprises a heat dissipation substrate 9.

More particularly, all of the circuit substrate 1, the image sensing chips 3, and the adhesive body 4 are coplanarly disposed on the top surface of the heat dissipation substrate 9, so that a back side 302 of each image sensing chip 3, a bottom surface 400 of the adhesive body 4, and a bottom surface 102 of the circuit substrate 1 are flush with each other and directly contact the heat dissipation substrate 9. Therefore, all of the circuit substrate 1, the image sensing chips 3, and the adhesive body 4 are coplanarly disposed on the heat dissipation substrate 9, and the adhesive body 4 is connected between each image sensing chip 3 and the circuit substrate 1, so that the optimum coplanarity of the image sensing chips 3 can be maintained and the clearness of images captured by the image capturing module M can be increased due to the rigidness provided by the circuit substrate 1 (such as a glass substrate or a silicon substrate having a predetermined circuit layout thereon).

Seventh Embodiment

Figure 8:
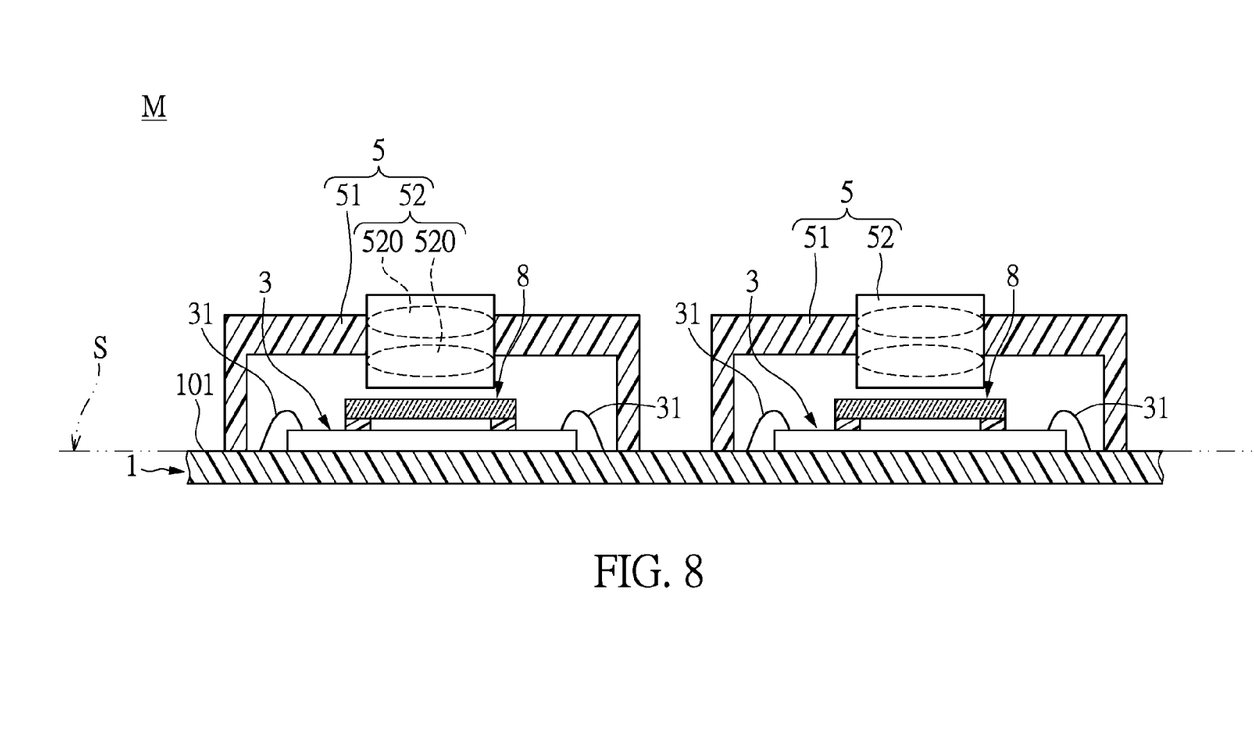
FIG. 8 shows a cross-sectional, schematic view of the image capturing module according to the seventh embodiment of the instant disclosure.

Referring to FIG. 8, the seventh embodiment of the instant disclosure provides an image capturing module M, comprising: a circuit substrate 1, a plurality of image sensing chips 3, and a plurality of lens modules 5. Please note, all of the image sensing chips 3 are coplanarly disposed on the circuit substrate 1 (i.e., the top surface 101 of the circuit substrate 1 is the datum plane S), so that the optimum coplanarity of the image sensing chips 3 can be maintained and the clearness of images captured by the image capturing module M can be increased due to the rigidness provided by the circuit substrate 1 (such as a glass substrate or a silicon substrate having a predetermined circuit layout thereon).

Eighth Embodiment

Figure 9:
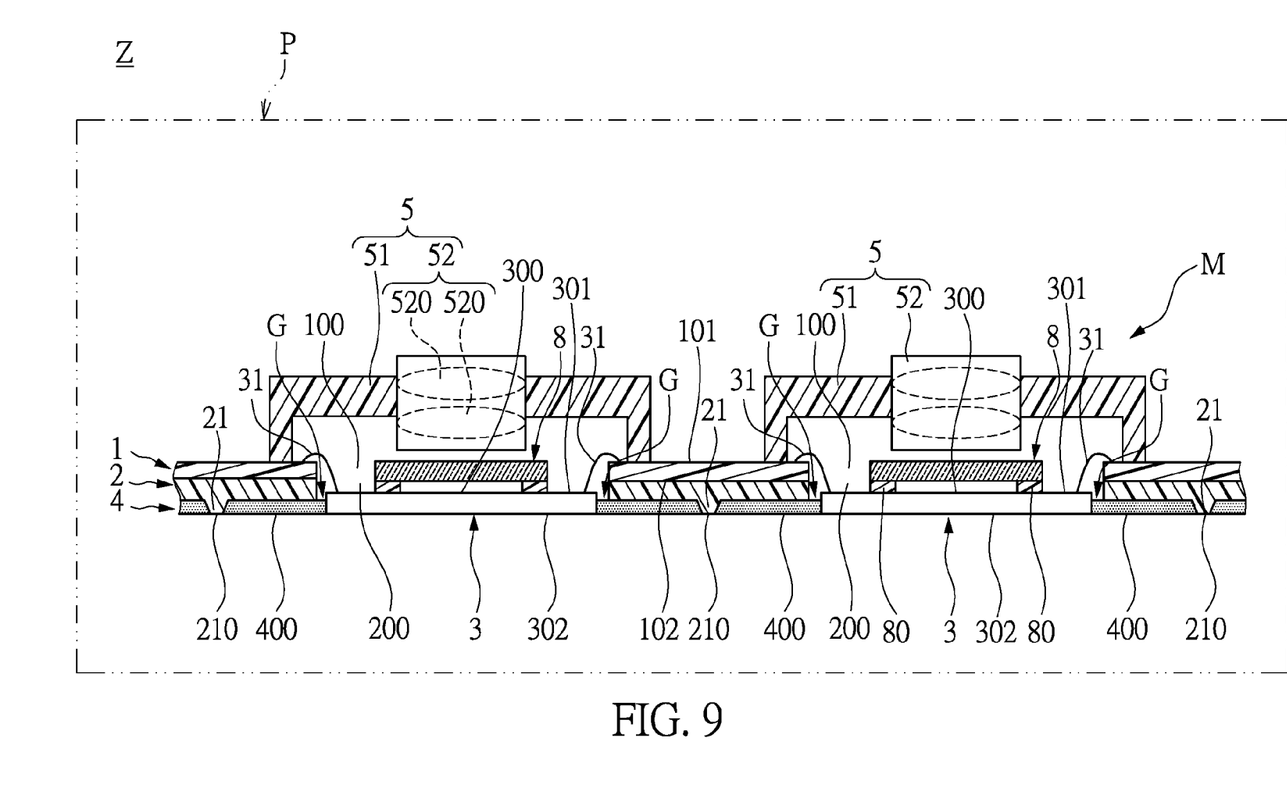
FIG. 9 shows a schematic view of the portable electronic device according to the eighth embodiment of the instant disclosure.

Referring to FIG. 9, the eighth embodiment of the instant disclosure provides a portable electronic device Z, comprising: an electronic module P and an image capturing module M. The image capturing module M is disposed on the electronic module P, and the image capturing module M comprises a circuit substrate 1, a structure reinforcing frame 2, a plurality of image sensing chips 3, an adhesive body 4, and a plurality of lens modules 5. For example, the electronic module P may be a smart phone or a notebook, and the image capturing module M of the first embodiment can be assembled inside the electronic module P, so that the electronic module P can be used to capture images through the image capturing module M.

In conclusion, the optimum coplanarity of the image sensing chips 3 can be maintained and the clearness of images captured by the image capturing module M can be increased due to the image sensing chips 3 being coplanarly disposed on a datum plane S and the adhesive body 4 being connected between each image sensing chip 3 and the structure reinforcing frame 2 (or the adhesive body 4 being connected between each image sensing chip 3 and the circuit substrate 1, or all of the image sensing chips 3 being coplanarly disposed on the top surface 101 of the circuit substrate 1).

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. An image capturing module, comprising:
   a circuit substrate having a top surface, a bottom surface, and a plurality of first passing openings connected between the top surface and the bottom surface;
   a structure reinforcing frame disposed on the bottom surface of the circuit substrate, wherein the structure reinforcing frame has a plurality of second passing openings respectively communicated with the first passing openings;
   a plurality of image sensing chips respectively disposed inside the second passing openings and electrically connected with the circuit substrate by wire bonding, wherein the image sensing chips are coplanarly disposed on a datum plane, each image sensing chip has an image sensing area disposed on a front side thereof, and the image sensing areas of the image sensing chips respectively face the first passing openings in the circuit substrate;
   an adhesive body disposed on the structure reinforcing frame, wherein the adhesive body is connected between each image sensing chip and the structure reinforcing frame for enclosing a gap between the image sensing chip and the structure reinforcing frame; and
   a plurality of lens modules disposed on the top surface of the circuit substrate, wherein each lens module includes an opaque casing disposed on the top surface of the circuit substrate and a lens assembly held by the opaque casing, and the lens assemblies of the lens modules respectively correspond to the image sensing areas of the image sensing chips.

2. The image capturing module of claim 1, wherein the structure reinforcing frame has a plurality of convex bodies opposite to the circuit substrate and passing through the adhesive body, and all of the image sensing chips, the adhesive body, and the convex bodies are coplanarly disposed on the datum plane, so that a back side of each image sensing chip, a bottom surface of the adhesive body, and a bottom surface of each convex body are flush with each other and exposed to the outside.

3. The image capturing module of claim 1, further comprising a heat dissipation substrate, wherein the structure reinforcing frame has a plurality of convex bodies opposite to the circuit substrate and passing through the adhesive body, and all of the image sensing chips, the adhesive body, and the convex bodies are coplanarly disposed on the heat dissipation substrate, so that a back side of each image sensing chip, a bottom surface of the adhesive body, and a bottom surface of each convex body are flush with each other and contact the heat dissipation substrate.

4. The image capturing module of claim 1, further comprising an auxiliary frame, a plurality of connection bodies, and a plurality of light-transmitting substrates, wherein the auxiliary frame is disposed on the top surface of the circuit substrate, and each connection body passes through the circuit substrate and is connected between the structure reinforcing frame and the auxiliary frame, so that the circuit substrate is firmly clamped between the structure reinforcing frame and the auxiliary frame, wherein the light-transmitting substrates are respectively disposed inside the first passing openings, each light-transmitting substrate is disposed above the corresponding image sensing chip through a plurality of support members, and each light-transmitting substrate is disposed between the corresponding image sensing chip and the corresponding lens assembly, wherein the image sensing chip is electrically connected to the circuit substrate through a plurality of conductive wires.

5. A portable electronic device, comprising:
   an electronic module; and
   an image capturing module disposed on the electronic module, wherein the image capturing module comprises:
      a circuit substrate having a top surface, a bottom surface, and a plurality of first passing openings connected between the top surface and the bottom surface;
      a structure reinforcing frame disposed on the bottom surface of the circuit substrate, wherein the structure reinforcing frame has a plurality of second passing openings respectively communicated with the first passing openings;
      a plurality of image sensing chips respectively disposed inside the second passing openings and electrically connected with the circuit substrate by wire bonding, wherein the image sensing chips are coplanarly disposed on a datum plane, each image sensing chip has an image sensing area disposed on a front side thereof, and the image sensing areas of the image sensing chips respectively face the first passing openings in the circuit substrate;
      an adhesive body disposed on the structure reinforcing frame, wherein the adhesive body is connected between each image sensing chip and the structure reinforcing frame for enclosing a gap between the image sensing chip and the structure reinforcing frame; and
      a plurality of lens modules disposed on the top surface of the circuit substrate, wherein each lens module includes an opaque casing disposed on the top surface of the circuit substrate and a lens assembly held by the opaque casing, and the lens assemblies of the lens modules respectively correspond to the image sensing areas of the image sensing chips.

6. The portable electronic device of claim 5, wherein the structure reinforcing frame has a plurality of convex bodies opposite to the circuit substrate and passing through the adhesive body, and all of the image sensing chips, the adhesive body, and the convex bodies are coplanarly disposed on the datum plane, so that a back side of each image sensing chip, a bottom surface of the adhesive body, and a bottom surface of each convex body are flush with each other and exposed to the outside.

7. The portable electronic device of claim 5, wherein the image capturing module further comprises a heat dissipation substrate, the structure reinforcing frame has a plurality of convex bodies opposite to the circuit substrate and passing through the adhesive body, and all of the image sensing chips, the adhesive body, and the convex bodies are coplanarly disposed on the heat dissipation substrate, so that a back side of each image sensing chip, a bottom surface of the adhesive body, and a bottom surface of each convex body are flush with each other and contact the heat dissipation substrate.

8. The portable electronic device of claim 5, wherein the image capturing module further comprises an auxiliary frame, a plurality of connection bodies, and a plurality of light-transmitting substrates, wherein the auxiliary frame is disposed on the top surface of the circuit substrate, and each connection body passes through the circuit substrate and is connected between the structure reinforcing frame and the auxiliary frame, so that the circuit substrate is firmly clamped between the structure reinforcing frame and the auxiliary frame, wherein the light-transmitting substrates are respectively disposed inside the first passing openings, each light-transmitting substrate is disposed above the corresponding image sensing chip through a plurality of support members, and each light-transmitting substrate is disposed between the corresponding image sensing chip and the corresponding lens assembly, wherein the image sensing chip is electrically connected to the circuit substrate through a plurality of conductive wires.

9. An image capturing module, comprising:
a circuit substrate having a plurality of first passing openings;
a plurality of image sensing chips respectively disposed inside the first passing openings and electrically connected with the circuit substrate by wire bonding, wherein the image sensing chips and the circuit substrate are coplanarly disposed on a datum plane;
an adhesive body connected between each image sensing chip and the circuit substrate; and
a plurality of lens modules disposed on the circuit substrate, wherein the lens modules respectively correspond to the image sensing chips.

10. The image capturing module of claim 9, further comprising a plurality of light-transmitting substrates, wherein each light-transmitting substrate is disposed above the corresponding image sensing chip through a plurality of support members, each light-transmitting substrate is disposed between the corresponding image sensing chip and the corresponding lens assembly, and the image sensing chip is electrically connected to the circuit substrate through a plurality of conductive wires.

\* \* \* \* \*